United States Patent [19]
Cama et al.

[11] Patent Number: 5,907,354
[45] Date of Patent: May 25, 1999

[54] MEMORY CARD HOUSING WITH A CENTER-ACTUATED EJECTOR

[75] Inventors: David M. Cama, Macedon; Anthony G. Chinnici, Rochester, both of N.Y.

[73] Assignee: Eastman Kodak Company, Rochester, N.Y.

[21] Appl. No.: 08/653,739

[22] Filed: May 23, 1996

[51] Int. Cl.[6] ................................................. H04N 5/76
[52] U.S. Cl. ........................ 348/231; 348/233; 348/373; 361/684
[58] Field of Search ................................. 439/159, 155; 361/684, 754, 747; 312/223.1, 223.2; 348/373, 231, 233; 386/118

[56] References Cited

U.S. PATENT DOCUMENTS

| | | | |
|---|---|---|---|
| 4,631,638 | 12/1986 | Felsner et al. | 361/415 |
| 4,778,395 | 10/1988 | Narita | 439/71 |
| 5,149,276 | 9/1992 | Dixon | 439/159 |
| 5,161,989 | 11/1992 | Okubo et al. | 439/159 |
| 5,179,505 | 1/1993 | Matsuo | 361/395 |
| 5,234,351 | 8/1993 | Dixon | 439/160 |
| 5,286,214 | 2/1994 | Takahashi | 439/159 |
| 5,299,089 | 3/1994 | Lwee | 361/684 |
| 5,303,062 | 4/1994 | Kawarai et al. | 358/335 |
| 5,324,204 | 6/1994 | Lwee | 439/64 |
| 5,383,789 | 1/1995 | Watanabe | 439/159 |
| 5,389,001 | 2/1995 | Broschard, III et al. | 439/159 |
| 5,401,176 | 3/1995 | Lwee | 439/64 |
| 5,432,673 | 7/1995 | Ogami et al. | 361/684 |
| 5,440,448 | 8/1995 | Stewart et al. | 361/684 |
| 5,470,241 | 11/1995 | Kaufman et al. | 439/159 |
| 5,675,475 | 10/1997 | Mazura et al. | 361/798 |

*Primary Examiner*—Wendy Garber
*Assistant Examiner*—Jacqueline Wilson
*Attorney, Agent, or Firm*—David M. Woods

[57] ABSTRACT

A housing for at least one removable memory package includes a connector section having a contact array for connecting to the package and an enclosure coupled to and extending from the connector section for supporting the package for connection to the connector section. The housing further includes an ejection mechanism for ejecting the package outwardly from the enclosure and an ejection release button, which is connected to the ejection mechanism for initiating ejection of the package and supported for movement in a direction that is approximately perpendicular to the ejecting package. By locating the ejection release button at the front surface of the eject mechanism, and sliding the eject button in a direction perpendicular to the direction of the ejecting package, the eject mechanism can be of narrow width.

19 Claims, 9 Drawing Sheets

MEMORY CARD HOUSING WITH A CENTER-ACTUATED EJECTOR

FIELD OF THE INVENTION

This invention relates to a housing for a memory card that serves as a data storage module for a digital device, such as a digital camera, and more particularly to an ejector mechanism for removing the card from the housing.

BACKGROUND OF THE INVENTION

Memory cards are used in a variety of electronic equipment. Typically, these cards contain a number of integrated circuits connected to an edge connector, which is interconnected to corresponding circuits of a digital device by means of a header connector mounted in the device. The memory cards are typically supported in some type of housing so that the contacts at the mating edge of the memory card will be aligned with the contacts of the header upon inserting the card into the housing. Since the card may need to be removed from electrical engagement with the header connector, it is desirable that there be some means to readily eject the card from electrical engagement with the connector.

Eject mechanisms shown in the prior art (e.g., see U.S. Pat. Nos. 5,401,176; 5,389,001; and 5,149,276) provide an eject linkage that allows a user to eject a memory card by pressing a button located on the side of the card housing. A typical design for such a memory card housing 10 is shown in FIG. 1. A side-actuated eject mechanism 12 includes an eject button 14 that is connected to one end of a linkage 16 that is pivoted about a fulcrum 18. The other end of the linkage 16 is connected to a sliding eject plate assembly 20 which has hooks (not shown) that forcibly eject a memory card(s) from the card housing 10 when the button 14 is depressed. The direction of button travel is parallel to but opposite that of the ejecting card. A similar second eject mechanism is located on the opposite side of the card housing to separately eject a second memory card. This second eject mechanism includes a second plate assembly (not shown), a second linkage 16', and a second button 14' for separately actuating the second eject mechanism.

The problem with incorporating an eject button on the side is that it results in a wider eject mechanism than would be desired in some applications. For instance, a bulky design is detrimental to compactness in an electronic camera. In some desirable locations on the camera body for the memory card housing, there is simply not enough width-wise dimension to accommodate much more than the memory card itself. A more compact design is obtained in U.S. Pat. Nos. 5,440,448; 5,432,673; and 5,234,351 by constructing an ejector with a sliding button accessible from either the top or the bottom of the eject mechanism. The direction of movement of the button is both parallel to and in the same direction as the ejecting memory card. However, this design increases the overall thickness of the memory card housing and requires finger access into the top and/or bottom of the housing in order to reach the eject button and to actuate the mechanism. In many applications, such as an electronic camera, such an eject access is either impractical or esthetically unappealing.

SUMMARY OF THE INVENTION

The present invention is directed to overcoming one or more of the problems set forth above. Briefly summarized, according to one aspect of the present invention, a housing for at least one removable memory package includes a connector section having a contact array for connecting to the package and an enclosure coupled to and extending from the connector section for supporting the package for connection to the connector section. The housing further includes an ejection mechanism for ejecting the package outwardly from the enclosure and an ejection release, which is connected to the ejection mechanism for initiating ejection of the package and supported for movement in a direction that is approximately perpendicular to the ejecting package.

By locating the ejection release button at the front surface of the eject mechanism, and sliding the eject button in a direction perpendicular to the direction of the ejecting package, the eject mechanism can be of narrow width, and not require an additional access location to the button for ejection purposes. This is the preferable method for such devices as electronic digital cameras, where the total camera width is critical, and the number of access doors must be kept minimized. The design can be modified to allow individual ejection of such storage devices when used with dual connector headers.

These and other aspects, objects, features and advantages of the present invention will be more clearly understood and appreciated from a review of the following detailed description of the preferred embodiments and appended claims, and by reference to the accompanying drawings.

DETAILED DESCRIPTION OF THE INVENTION

Figure 1:
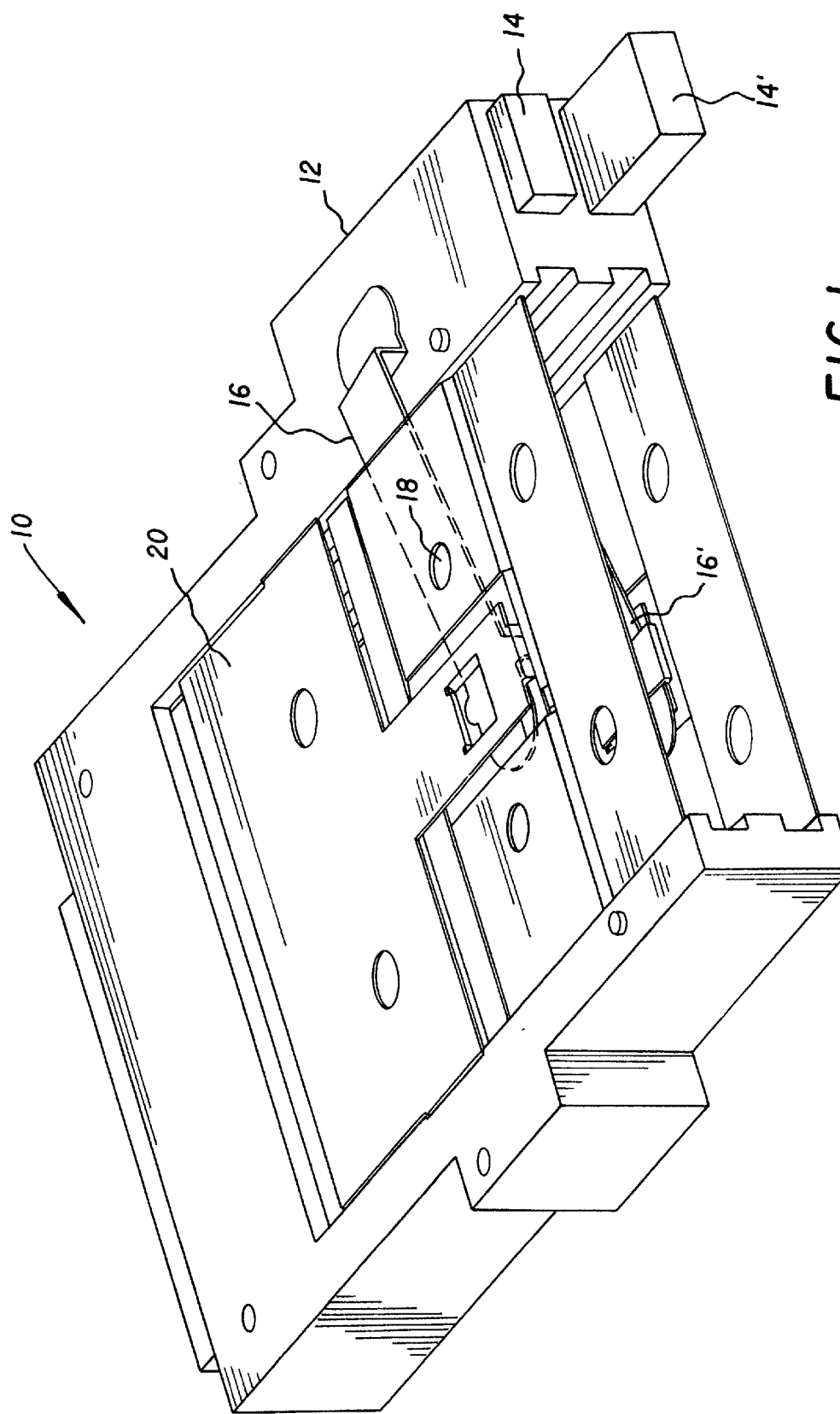
FIG. 1 shows a perspective view of a memory card housing with a side-actuated ejector as known from the prior art.

Referring now to FIGS. 2–5, the memory card housing 10 includes a connector section 22 for connecting a digital device to one or two memory cards 24 and 26. A card enclosure is formed by a pair of opposed sidewalls 28 and 30 extending from the connector section 22 in parallel relation and spaced substantially equal to the width of the memory card 24 (or 26). Each guide wall 28 and 30 has a set of guide grooves 32a and 32b (shown on one side only) for supporting the memory card 24 (or 26) for sliding movement into and out of the housing 10. The grooved guide walls 28 and 30 consequently define two storage areas: an upper storage space 33a for the memory card 24 and an lower storage space 33b for the memory card 26. A crosspiece 34 separates the end of the guide walls 28, 30 opposite to the connector section 22 and defines an insertion port 36 for inserting the memory cards 24, 26 into the guide grooves 32a, b.

Figure 2:
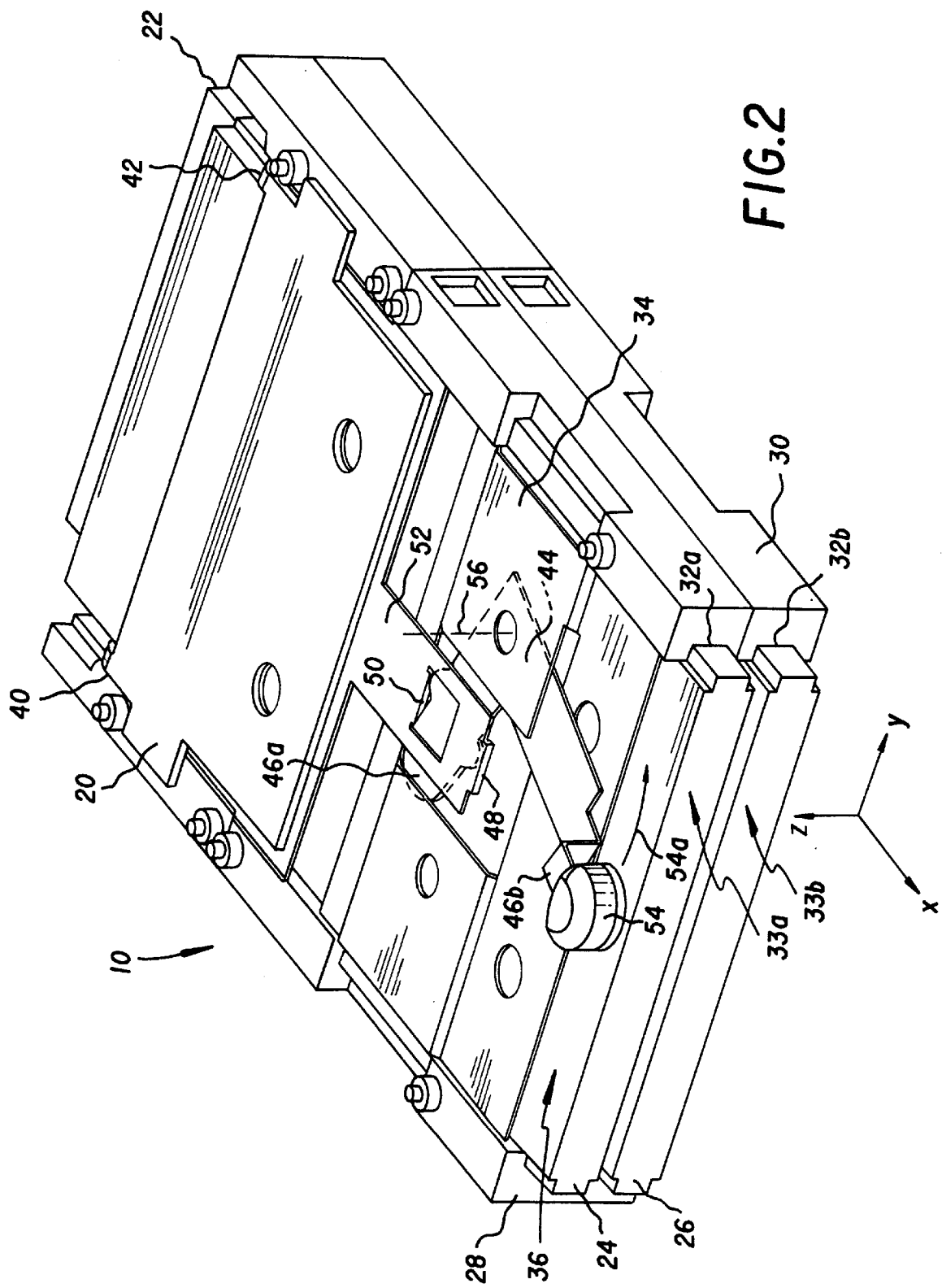
FIG. 2 shows a perspective view of a memory card housing with a center-actuated ejector shown from the bottom according to the invention.
Figure 3:
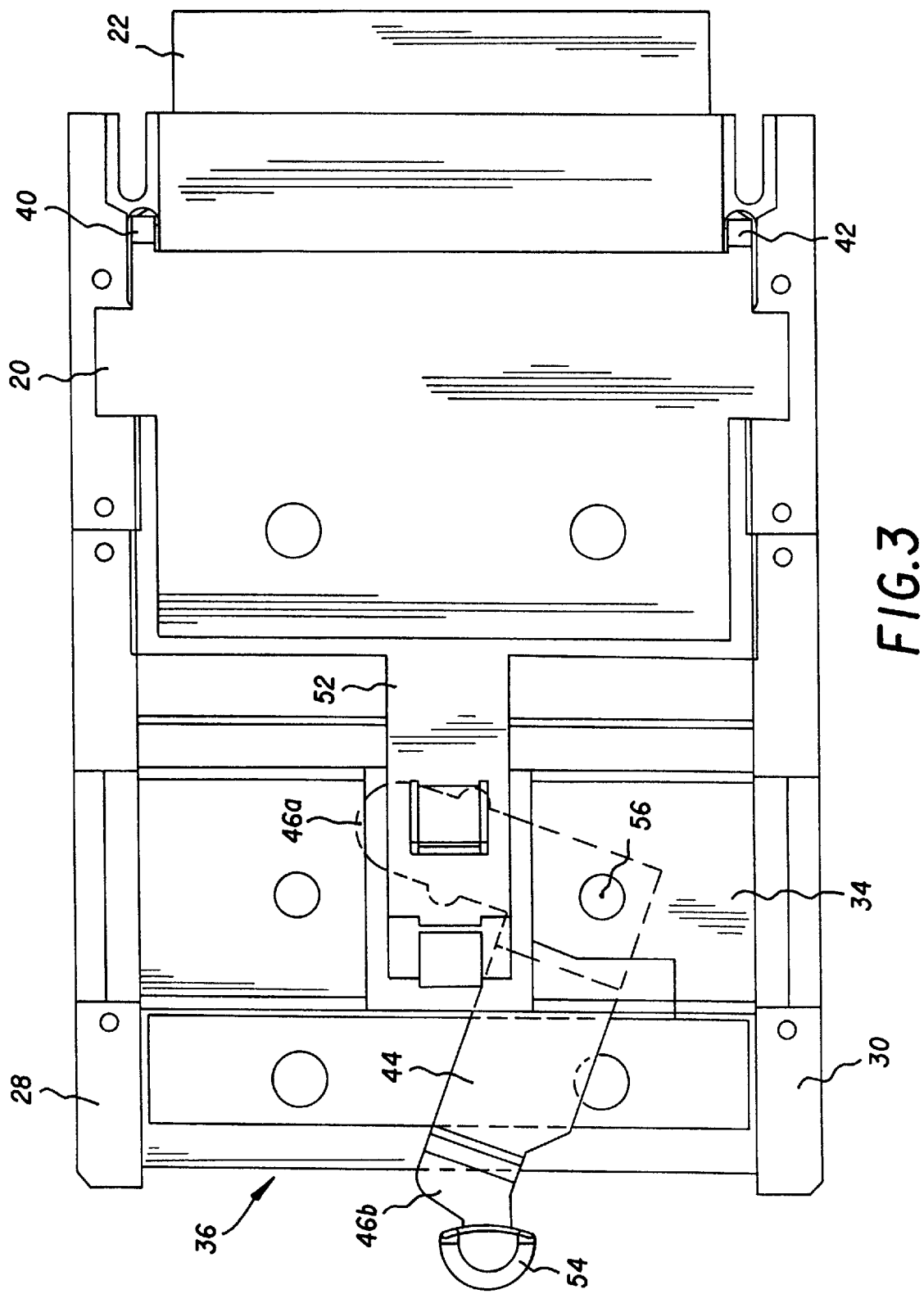
FIG. 3 is a plan view from the bottom of the memory card housing shown in FIG. 2.
Figure 4:
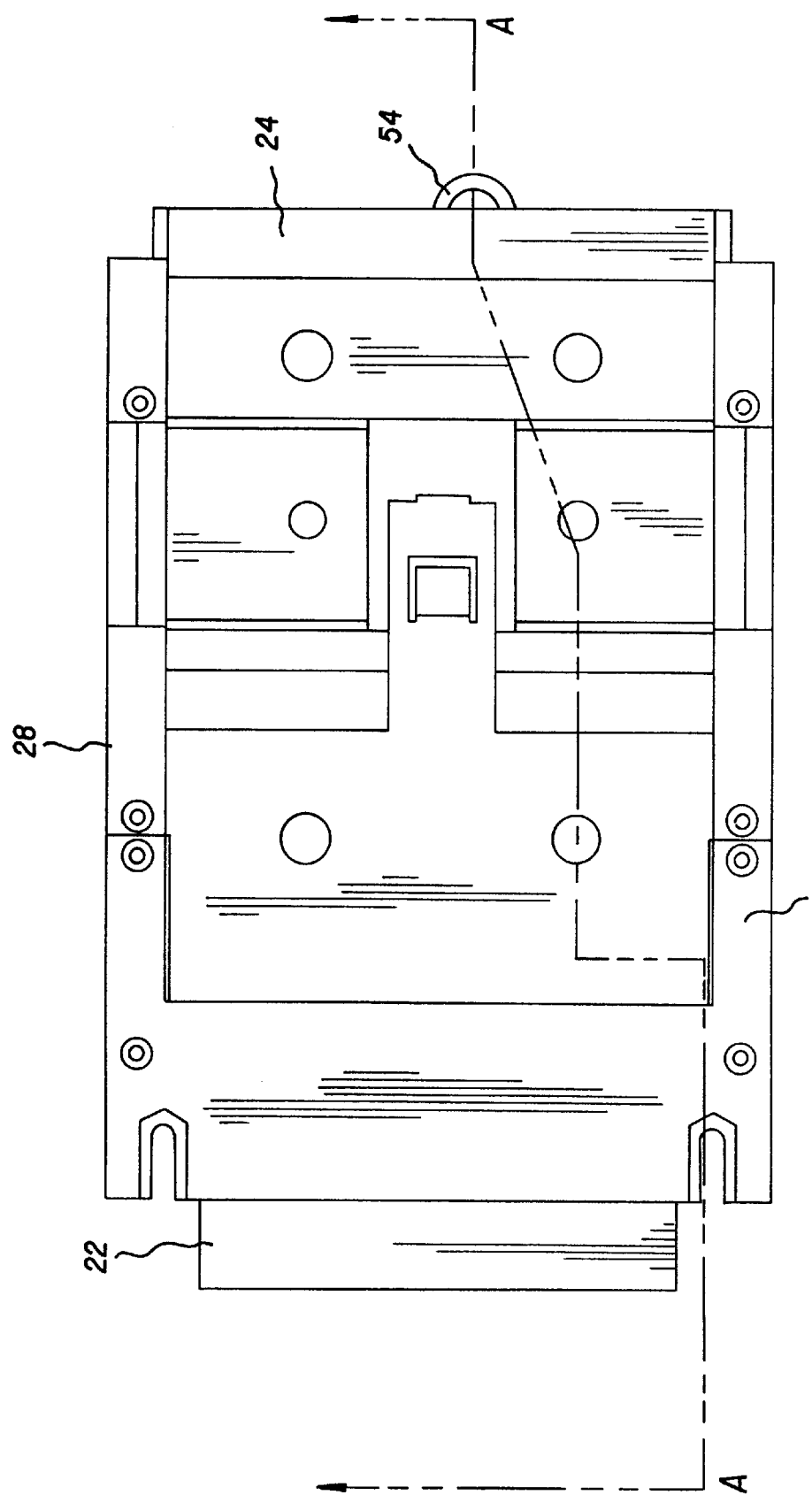
FIG. 4 is a plan view from the top of the memory card housing shown in FIG. 2.
Figure 5:
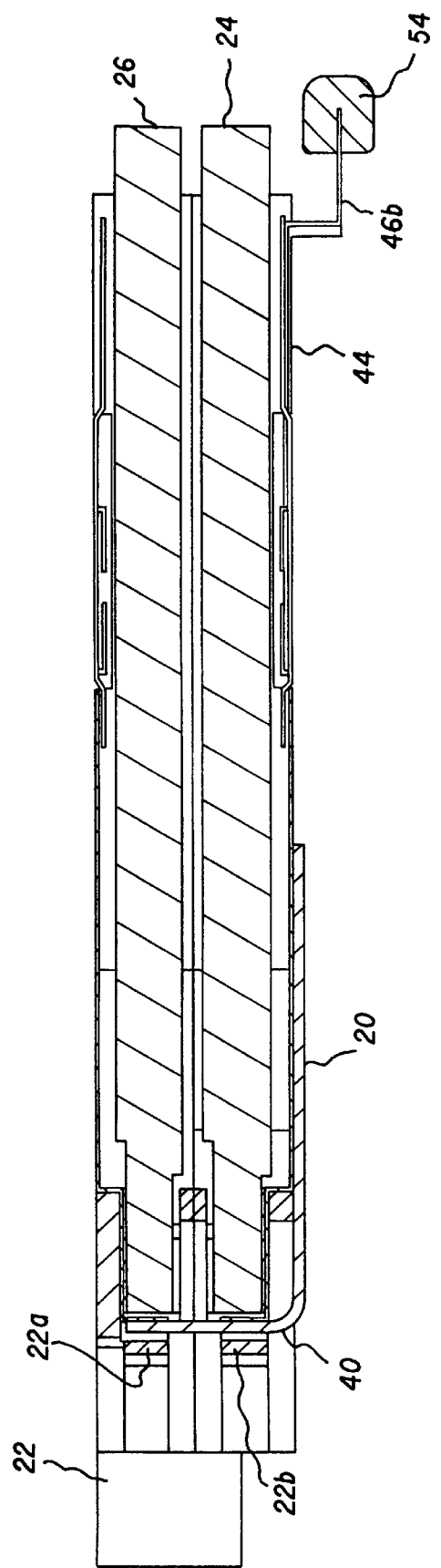
FIG. 5 is a side sectional view of the memory card housing taken along the line A—A shown in FIG. 4.
Figure 9:
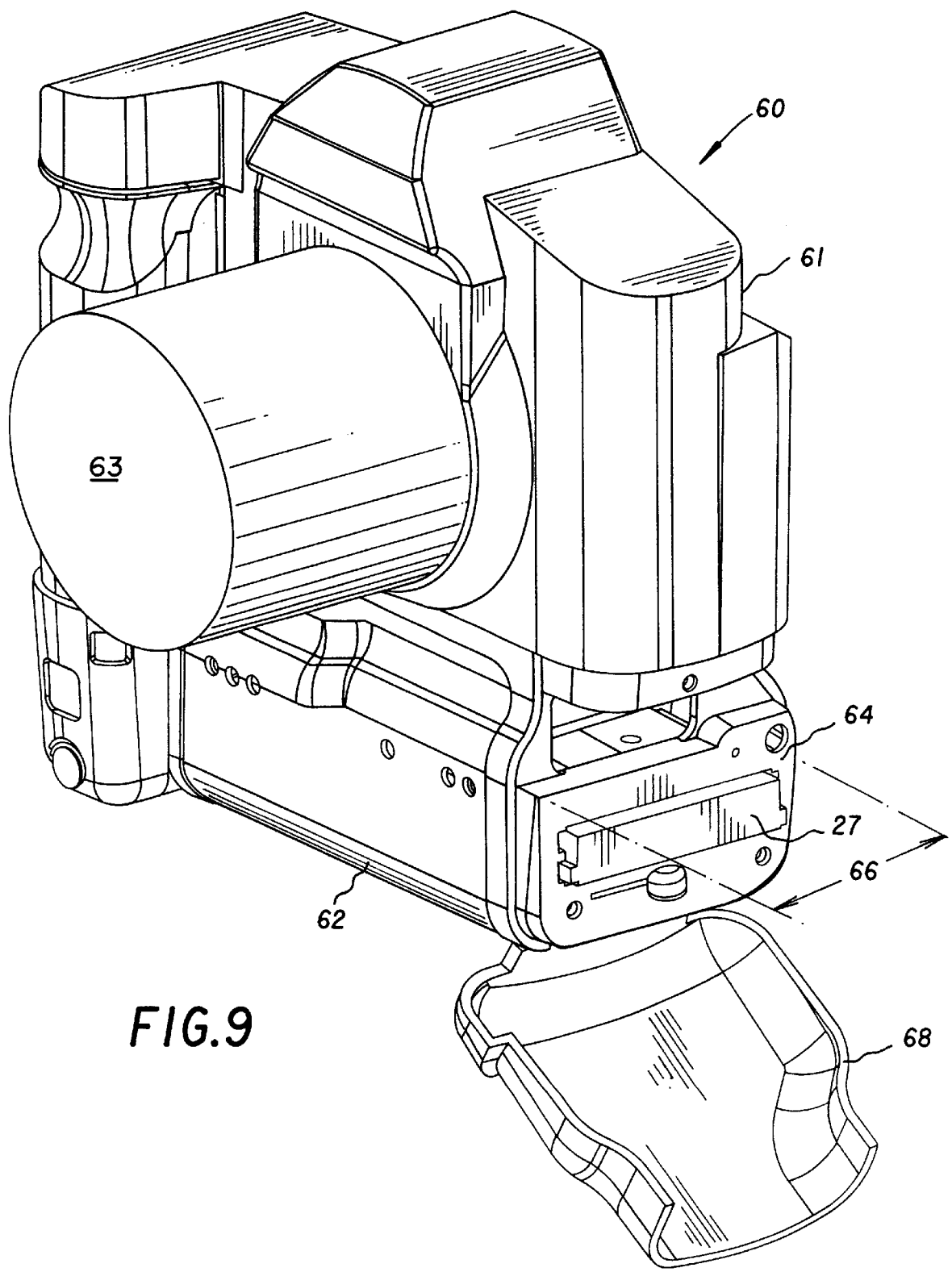
FIG. 9 is a perspective view of an electronic camera incorporating a memory card housing according to the invention as shown in FIG. 2.

The memory cards 24,26 shown in FIGS. 2 and 5 are known in the art and essentially comprise a random access memory (RAM) incorporated into a card-like enclosure. Such a card represents a non-volatile device, which once it has been loaded with data, can be withdrawn from the housing 10 and the connector section 22. Sockets (not shown) formed in the forward end faces of the memory cards 24,26 mate with respective contact arrays 22a, 22b (FIG. 5) on the edge of the connector section 22. A low profile hard disk drive package can also be fitted into the housing 10. As shown in FIG. 9, a hard drive package 27 is a double height memory card that occupies both storage areas 33a and 33b. In this case, a single socket (not shown) on the forward end face of the package engages the lower contact array 22b in the connection section 22.

An ejection mechanism includes the sliding eject plate assembly 20, which is supported for movement between the sidewalls (e.g., in appropriate grooves (not shown)) for ejecting the memory cards 24, 26. The rearward edge of the plate assembly 20 facing the connector section 22 includes a pair of eject hooks 40, 42 which protrude into the storage areas 33a, 33b occupied by the memory cards 24, 26 and engage the edges thereof. The ejection mechanism further includes a pivot lever 44, which has an end 46a that is captured between downturned flanges 48, 50 in a protrusion 52 from the sliding plate 20. The other end 46b of the pivot lever 44 supports an ejection release, such as a user engageable release handle 54.

The pivot lever 44 is an angled member that is pivoted substantially at its apex about a fulcrum 56 that is maintained on the crosspiece 34. In use, movement of the release handle 54 in a direction approximately perpendicular to the direction x of the ejecting memory card 24, 26 causes motion of the sliding plate assembly 20 in the direction x. The motion of the release handle 54 thus is approximately in the direction y. Consequently, the eject hooks 40, 42 force the cards 24, 26 out of the insertion port 36, and the housing 10. Though the movement of the release handle 54 is actually in a shallow arc 54a, it is to be understood that this movement is intended to be described as approximately perpendicular to the direction x.

Figure 6:
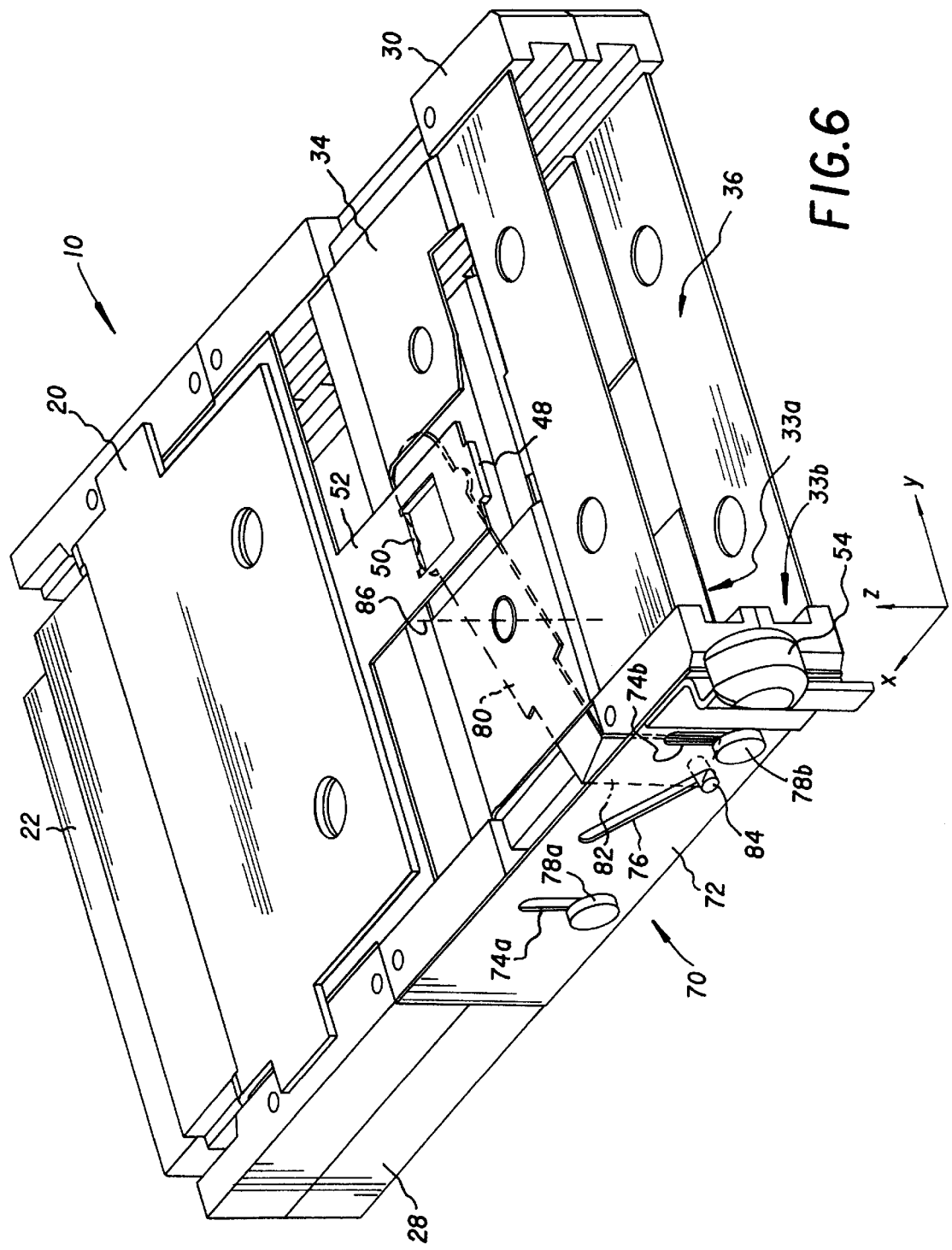
FIG. 6 shows a perspective view of a second embodiment of a memory card housing with a compact side-actuated ejector shown from the bottom according to the invention.

As shown in the sectional view in FIG. 6, the memory cards 24, 26 are fully inserted into the housing 10 until the socket area of the cards 24, 26 are engaging the corresponding contact arrays 22a, 22b in the connector 22. As shown, the release handle 54 protrudes slightly outward, and below, the housing 10. The advantage of this positioning is shown in FIG. 9, wherein the housing 10 occupies the widthwise-dimension of a camera 60. In particular, the camera includes a camera body 61, an electronics module 62, and a lens 63. The housing 10 is supported within the electronics module 62 on the bottom of the camera body 61. By locating the release handle 54 on a front surface 64 of the housing 10, and sliding the button in a direction perpendicular to the direction on an ejecting card, the eject mechanism and housing can be a narrow width 66 that fits into the electronics module 62 and can be neatly enclosed by a cover 68.

Figure 7:
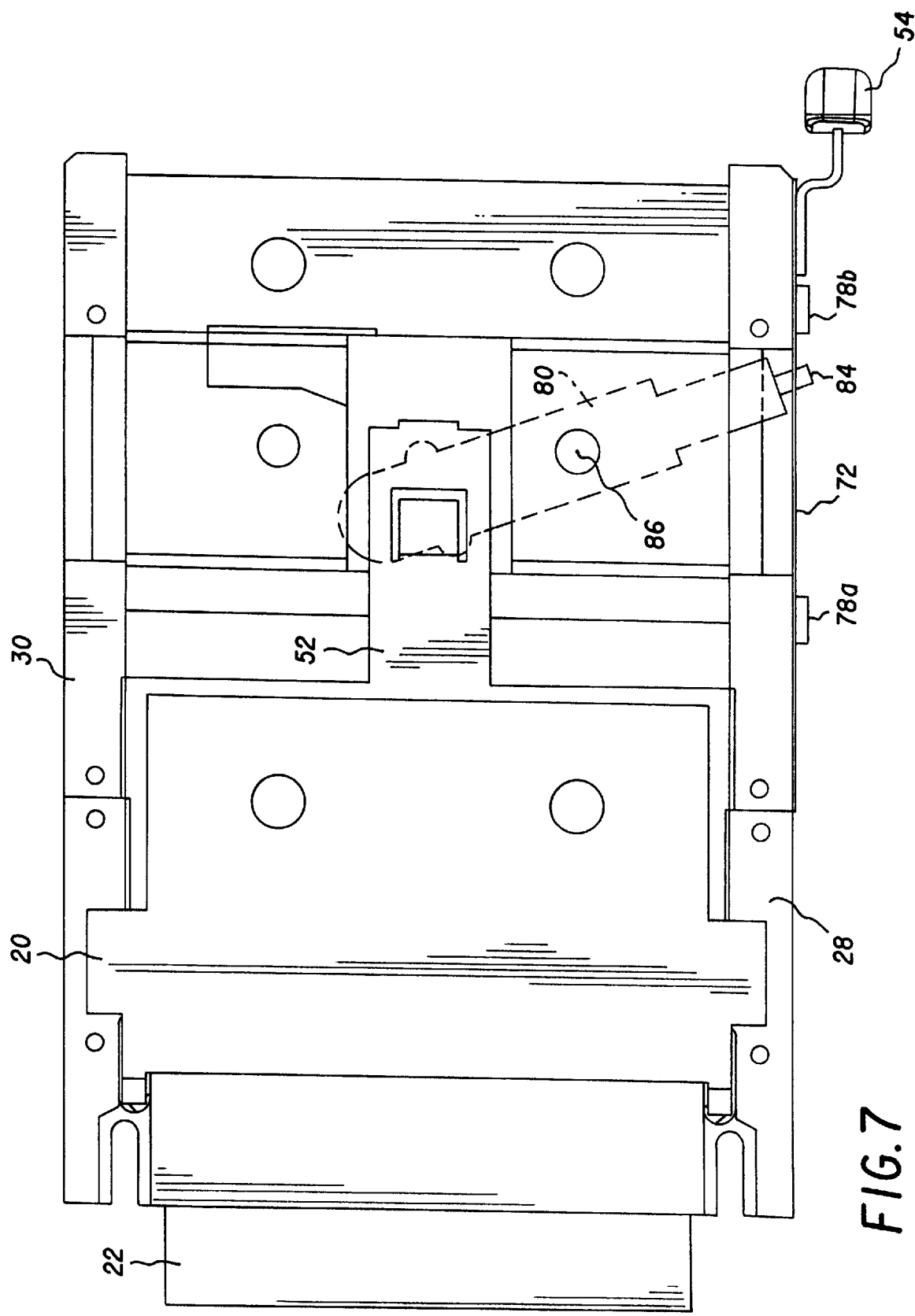
FIG. 7 is a plan view from the bottom of the memory card housing shown in FIG. 6.
Figure 8:
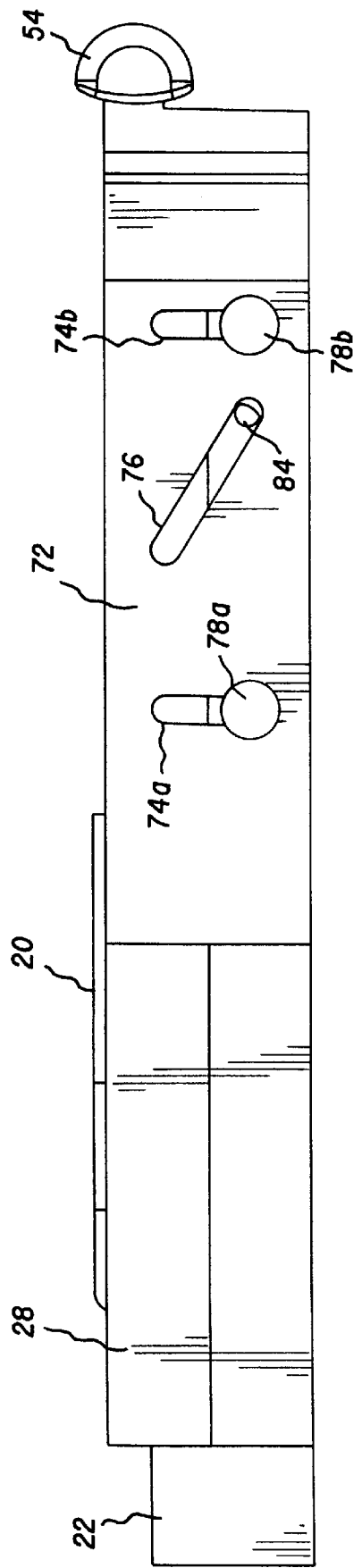
FIG. 8 is a side elevation of the memory card housing shown in FIG. 6.

Referring to FIGS. 6, 7, and 8, a second embodiment of the invention is shown, where features in common with the first embodiment retain the same reference characters. This embodiment illustrates a side-actuated eject mechanism 70 that allows compact placement of the release handle 54 near to the insertion port 36. The eject mechanism 70 includes a sliding plate 72, which has a pair of vertical guide slots 74a, 74b and a camming slot 76. The release handle 54 is attached to an end of the plate 72. The plate 72 is supported for vertical movement by a pair of flanged posts 78a, 78b attached to the sidewall 28. Movement of the eject plate assembly 20 is caused by a linkage 80 having a downturned arm 82 with a camming post 84 that engages the camming slot 76. The other end of the linkage 80 is connected to the protrusion 52.

In operation, movement of the release handle 54 downward (in the z direction), and the plate 72 therewith, cause the cam post 84 to slide upward in the camming slot 76. The linkage 80 consequently rotates in a clockwise direction around a fulcrum 86 fixed to the crosspiece 34, and the plate assembly 20 is moved in the x direction to eject memory cards 24, 26. As was the case with the first embodiment, the release handle 54 moves in an approximately perpendicular direction relative to the ejecting memory cards 24, 26—albeit in the z direction, rather than in the y direction.

The invention has been described with reference to a preferred embodiment. However, it will be appreciated that variations and modifications can be effected by a person of ordinary skill in the art without departing from the scope of the invention. For example, it should be clear that the memory card housing disclosed herein is not limited to electronics cameras—and may find use in desk-top or portable computers, and a variety of similar devices. Furthermore, the two cards 24 and 26 could be controlled and ejected separately if a second eject mechanism were provided for the second card. The second eject mechanism would be located on the opposite side of the card housing 10, as shown from FIG. 2, and analogous to the placement of the second eject mechanism in FIG. 1. Although not shown separately in FIG. 2, there would be a second eject plate assembly similar to assembly 20, a second pivot lever similar to lever 44, and a second release handle similar to handle 54—all located on the opposite side of the card housing. The hooks 42 extending from the respective plate assemblies would each engage only one of the cards. Moreover, the side-actuated design shown in FIG. 6 could also be modified for separate ejection of each card by providing a second side-actuated eject mechanism, similar to mechanism 70, on the other side of the card housing 10.

PARTS LIST 10 memory card housing
12 side-actuated eject mechanism 14 eject button
16 linkage
18 fulcrum
20 sliding eject plate assembly
22 connection section
22a, b contact arrays
24 memory card
26 memory card
27 hard drive package
28 sidewall
30 sidewall
32a, b guide grooves
33a, b upper, lower storage areas
34 cross piece
36 insertion port
38 plate grooves
40 eject hook
42 eject hook
44 pivot lever
46a, b end
48 flange
50 flange
52 protrusion
54 release handle
56 fulcrum
60 camera
61 body
62 electronics module
63 lens
64 front surface
66 width
70 side-actuated eject mechanism
72 sliding plate
74a, b, vertical guide slots
76 camming slot
78a, b flanged posts
80 linkage
82 downturned arm
84 cam post
86 fulcrum

We claim:

1. A housing for at least one removable memory package, said housing enabling storage and ejection of the package from the housing, said housing comprising:

a connector section having a contact array for connecting to the package;

an enclosure coupled to and extending from the connector section for supporting at least one package for connection to the connector section;

an ejection mechanism for ejecting the package outwardly from the enclosure; and an ejection release connected to the ejection mechanism for initiating ejection of the package, said ejection release supported for movement in a direction that is approximately perpendicular to the ejecting package.

2. A housing as claimed in claim 1 wherein the package is a memory card.

3. A housing as claimed in claim 1 wherein the package is a hard drive card.

4. A housing as claimed in claim 1 wherein the enclosure accommodates either two memory cards or one hard drive card.

5. A housing as claimed in claim 1 wherein the enclosure includes an insertion port through which the package is loaded, and the ejection release is center-actuated in relation to the insertion port.

6. A housing as claimed in claim 1 wherein the enclosure includes an insertion port through which the package is loaded, and the ejection release is side-actuated in relation to the insertion port.

7. A housing for at least one removable memory package, said housing enabling storage and ejection of the package from the housing, said housing comprising:

a connector section having a contact array for connecting to the package;

an enclosure coupled to and extending from the connector section for supporting at least one package for connection to the connector section;

an ejection mechanism for ejecting the package outwardly from the enclosure, said ejection mechanism comprising a sliding member mounted for movement adjacent the enclosure and means extending from the sliding member for engaging the package during ejection; and a linkage attached to the sliding member at one end thereof and having a user-engageable release handle at the opposite end thereof, said release supported for movement by the linkage in a direction that is approximately perpendicular to the ejecting package, whereby movement of the release handle in a direction approximately perpendicular to the ejecting memory package causes ejecting movement of the sliding eject plate, and the memory package therewith, out of the housing.

8. A housing as claimed in claim 7 wherein the package is a memory card.

9. A housing as claimed in claim 7 wherein the package is a hard drive card.

10. A housing as claimed in claim 7 wherein the enclosure accommodates either two memory cards or one hard drive card.

11. A housing as claimed in claim 7 wherein the enclosure includes an insertion port through which the package is loaded, and the release handle is arranged on the linkage to be center-actuated in relation to the insertion port.

12. A housing as claimed in claim 7 wherein the enclosure includes an insertion port through which the package is loaded, and the release handle is arranged on the linkage to be side-actuated in relation to the insertion port.

13. A memory card housing for at least one memory card, said housing enabling insertion and ejection of the card from the housing, said memory card housing comprising:

a connector section having a contact array for connecting to the memory card;

a pair of opposed side walls coupled to and extending from the connector section in parallel relation and spaced substantially equal to the width of the memory card, said walls having guide grooves for supporting at least one memory card;

a crosspiece separating the end of the side walls opposite to the connector section and defining an insertion port for inserting said at least one memory card into the guide grooves;

a sliding eject plate supported for movement between the side walls for ejecting the memory card;

a pivot lever attached to the sliding eject plate at one end thereof and having a user-engageable release handle at the opposite end thereof, said pivot lever comprising an angled member pivoted about a fulcrum on the crosspiece such that lateral movement of the release handle in a direction approximately perpendicular to the ejecting memory card causes ejecting movement of the sliding eject plate, and the memory card therewith, out of the card housing.

14. A housing as claimed in claim 13 wherein the memory card includes solid state random access memory.

15. A housing as claimed in claim 13 wherein the memory card is a hard drive card including a hard drive magnetic memory.

16. A housing as claimed in claim 13 wherein the housing accommodates either two random access memory cards or one hard drive card.

17. A housing as claimed in claim 13 wherein the release handle is arranged on the pivot lever to be center-actuated in relation to the insertion port.

18. A housing as claimed in claim 13 wherein the release handle is arranged on the pivot lever to be side-actuated in relation to the insertion port.

19. An electronic camera including a housing for at least one removable memory card, said housing enabling storage and ejection of the card from the camera, said camera comprising:

a connector section in the camera having a contact array for connecting to the card;

an enclosure in the camera coupled to and extending from the connector section for supporting at least one card for connection to the connector section;

an ejection mechanism for ejecting the package outwardly from the enclosure, said ejection mechanism comprising a sliding member mounted for movement adjacent the enclosure and means extending from the sliding member for engaging the card during ejection; and a linkage attached to the sliding member at one end thereof and having a user-engageable release handle at the opposite end thereof, said release supported for movement by the linkage in a direction that is approximately perpendicular to the ejecting card, whereby movement of the release handle in a direction approximately perpendicular to the ejecting memory card causes ejecting movement of the sliding eject plate, and the memory card therewith, out of the camera.

* * * * *